(12) United States Patent
Sumino

(10) Patent No.: US 11,223,184 B2
(45) Date of Patent: Jan. 11, 2022

(54) SEMICONDUCTOR LASER DRIVER HAVING ELECTRONIC DIMMING FUNCTION WITHOUT USING OPTICAL COMPONENTS

(71) Applicant: RICOH ELECTRONIC DEVICES CO., LTD., Osaka (JP)

(72) Inventor: Daijiro Sumino, Osaka (JP)

(73) Assignee: RICOH ELECTRONIC DEVICES CO., LTD., Osaka (JP)

( * ) Notice: Subject to any disclaimer, the term of this patent is extended or adjusted under 35 U.S.C. 154(b) by 192 days.

(21) Appl. No.: 16/644,238

(22) PCT Filed: Sep. 5, 2018

(86) PCT No.: PCT/JP2018/032939
§ 371 (c)(1),
(2) Date: Mar. 4, 2020

(87) PCT Pub. No.: WO2019/049908
PCT Pub. Date: Mar. 14, 2019

(65) Prior Publication Data
US 2020/0366057 A1 Nov. 19, 2020

(30) Foreign Application Priority Data
Sep. 6, 2017 (JP) .............................. JP2017-171458

(51) Int. Cl.
*H01S 5/042* (2006.01)
*H01S 5/062* (2006.01)

(52) U.S. Cl.
CPC ............ *H01S 5/0427* (2013.01); *H01S 5/062* (2013.01)

(58) Field of Classification Search
CPC ............... H01S 5/0427; H01S 5/06213; H01S 5/06241; H01S 5/062; H04N 9/77–78
See application file for complete search history.

(56) References Cited

U.S. PATENT DOCUMENTS 5,638,090 A * 6/1997 Schnaitter .............. G09G 1/285
345/419
5,640,381 A * 6/1997 Call ....................... G11B 7/126
369/116

(Continued)

FOREIGN PATENT DOCUMENTS

CN 108243542 A * 7/2018 ........... H04N 9/3182
EP 0469929 A2 * 2/1992 ............. G06K 1/126

(Continued)

OTHER PUBLICATIONS

International Search Report dated Nov. 16, 2018 for counterpart International Patent Application No. PCT/JP2018/032939 filed Sep. 5, 2018.

*Primary Examiner* — Joshua King
(74) *Attorney, Agent, or Firm* — Cooper & Dunham; Paul Teng

(57) ABSTRACT

A first current generator circuit generates a first current having a current value variable in accordance with a first control signal. A second current generator circuit generates a second current by limiting the first current so as to have a current value variable in accordance with a second control signal. A third current generator circuit generates a third current by limiting the second current so as to have a current value variable in accordance with a third control signal, and supplies the third current to the semiconductor laser element. Rates at which the first and second control signals change are set to be lower than a rate at which the third control signal changes.

10 Claims, 11 Drawing Sheets

(56) References Cited

U.S. PATENT DOCUMENTS

| | | | |
|---|---|---|---|
| 5,912,694 A | 6/1999 | Miyake et al. | |
| 6,370,175 B1 * | 4/2002 | Ikeda | H04N 1/40037 |
| | | | 347/236 |
| 7,265,743 B2 * | 9/2007 | Funamoto | G09G 3/3406 |
| | | | 345/102 |
| 8,294,745 B2 * | 10/2012 | Yamashita | B41J 2/473 |
| | | | 347/236 |
| 8,379,681 B2 * | 2/2013 | Kyogoku | H01S 5/042 |
| | | | 372/38.01 |
| 10,839,732 B2 * | 11/2020 | Ukai | H04N 9/3182 |
| 10,948,813 B2 * | 3/2021 | Ke | H04N 9/3155 |
| 2006/0007971 A1 | 1/2006 | Sato et al. | |
| 2007/0053395 A1 | 3/2007 | Kamatani et al. | |
| 2008/0117943 A1 * | 5/2008 | Nishiyama | H01S 5/06832 |
| | | | 372/29.02 |
| 2009/0190943 A1 * | 7/2009 | Yamashita | G03G 15/043 |
| | | | 399/51 |
| 2009/0230879 A1 * | 9/2009 | Bergmann | G05F 3/262 |
| | | | 315/291 |
| 2010/0316072 A1 * | 12/2010 | Deladurantaye | H01S 5/06216 |
| | | | 372/29.02 |
| 2011/0228036 A1 | 9/2011 | Kyogoku | |
| 2013/0258210 A1 * | 10/2013 | Kurihara | H04N 9/3161 |
| | | | 348/750 |
| 2014/0240611 A1 * | 8/2014 | Kimura | G02B 27/48 |
| | | | 348/750 |
| 2017/0214893 A1 * | 7/2017 | Naftali | H04N 9/3161 |
| 2017/0280117 A1 * | 9/2017 | Ogi | H04N 9/3155 |
| 2018/0331499 A1 * | 11/2018 | Bellingrath | G01R 19/0092 |
| 2019/0355290 A1 * | 11/2019 | Hayakawa | H01S 5/042 |

FOREIGN PATENT DOCUMENTS

| | | | | |
|---|---|---|---|---|
| EP | 2101241 A1 * | 9/2009 | | G05F 3/262 |
| JP | H11291548 A * | 10/1999 | | H04N 1/40037 |
| JP | 2003529224 A * | 9/2003 | | H01S 5/0687 |
| JP | 2006180517 A * | 7/2006 | | H03F 1/3223 |
| JP | 3880914 | 2/2007 | | |
| JP | 2007-73543 | 3/2007 | | |
| JP | 2007212737 A * | 8/2007 | | |
| JP | 4427277 | 3/2010 | | |
| JP | 2011-198918 | 10/2011 | | |
| JP | 2011198919 A * | 10/2011 | | B41J 2/471 |
| JP | 5163116 | 3/2013 | | |
| JP | 5672845 | 2/2015 | | |
| JP | 6334183 B2 * | 5/2018 | | H01S 5/0427 |
| JP | 2018190619 A * | 11/2018 | | |
| KR | 20100094925 A * | 8/2010 | | |
| WO | WO2004/040721 A1 | 5/2004 | | |
| WO | WO-2006097559 A2 * | 9/2006 | | H01S 5/50 |
| WO | WO2009/084468 A1 | 7/2009 | | |
| WO | WO-2009084468 A1 * | 7/2009 | | H01S 5/042 |
| WO | WO-2016158035 A1 * | 10/2016 | | H01S 5/062 |
| WO | WO-2018008644 A1 * | 1/2018 | | G09G 3/025 |
| WO | WO-2018101121 A1 * | 6/2018 | | G09G 3/20 |
| WO | WO-2021139967 A1 * | 7/2021 | | G09G 3/3258 |

* cited by examiner

[Fig. 1]
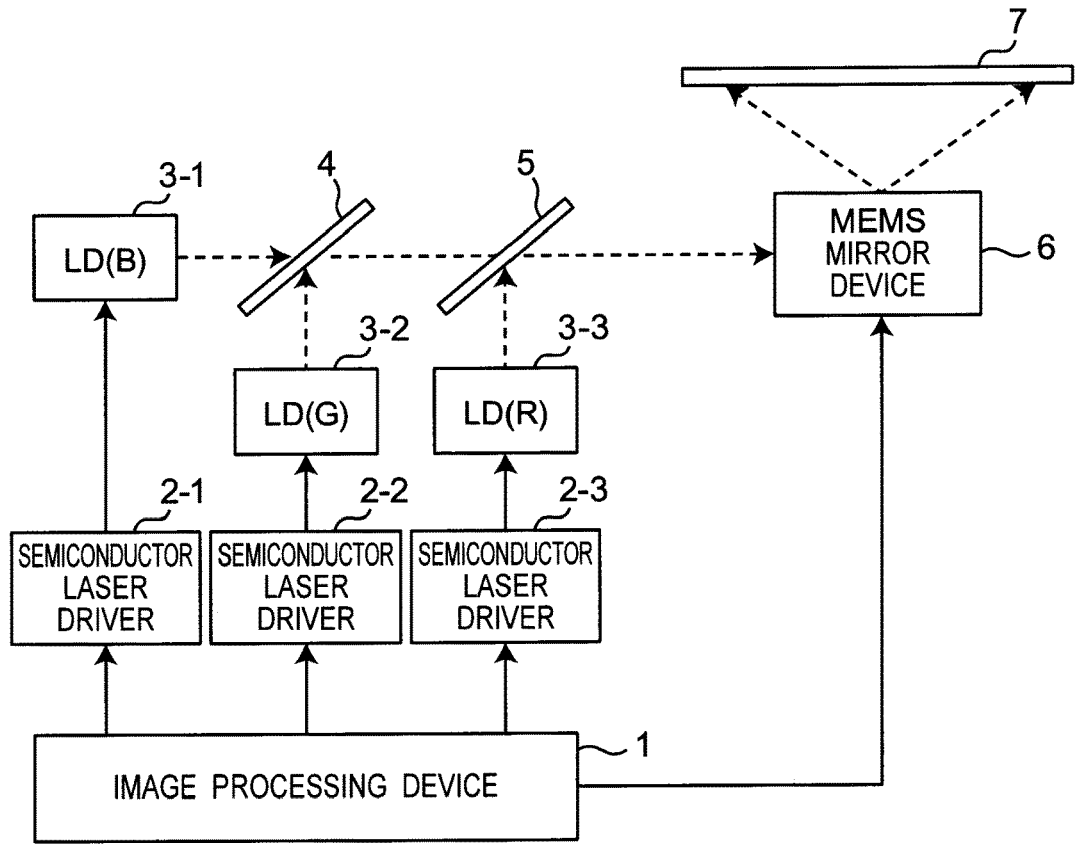
[Fig. 2]
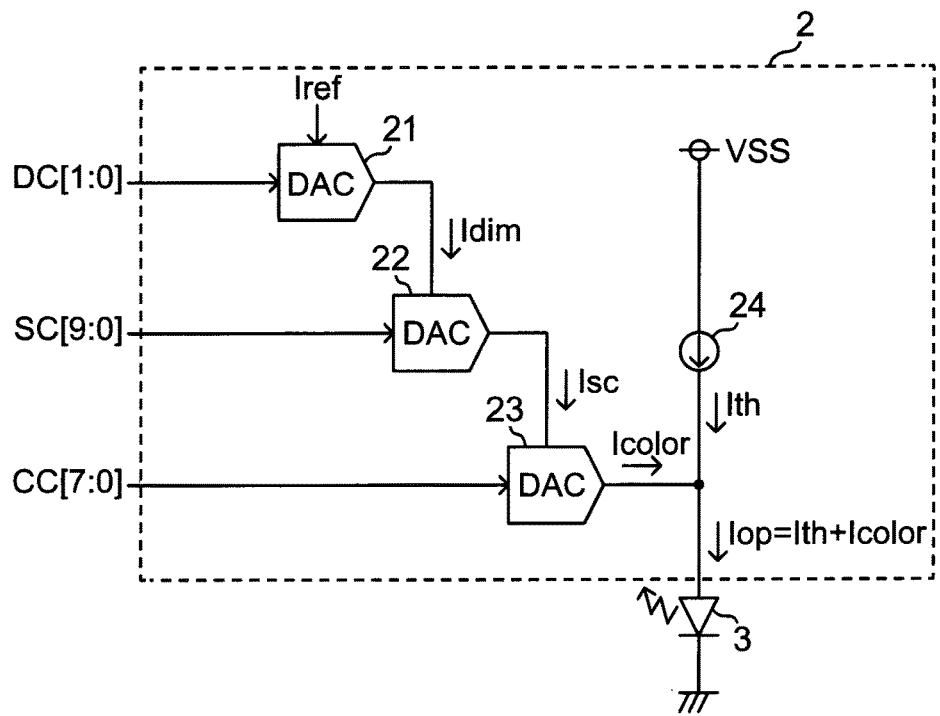

[Fig. 3]
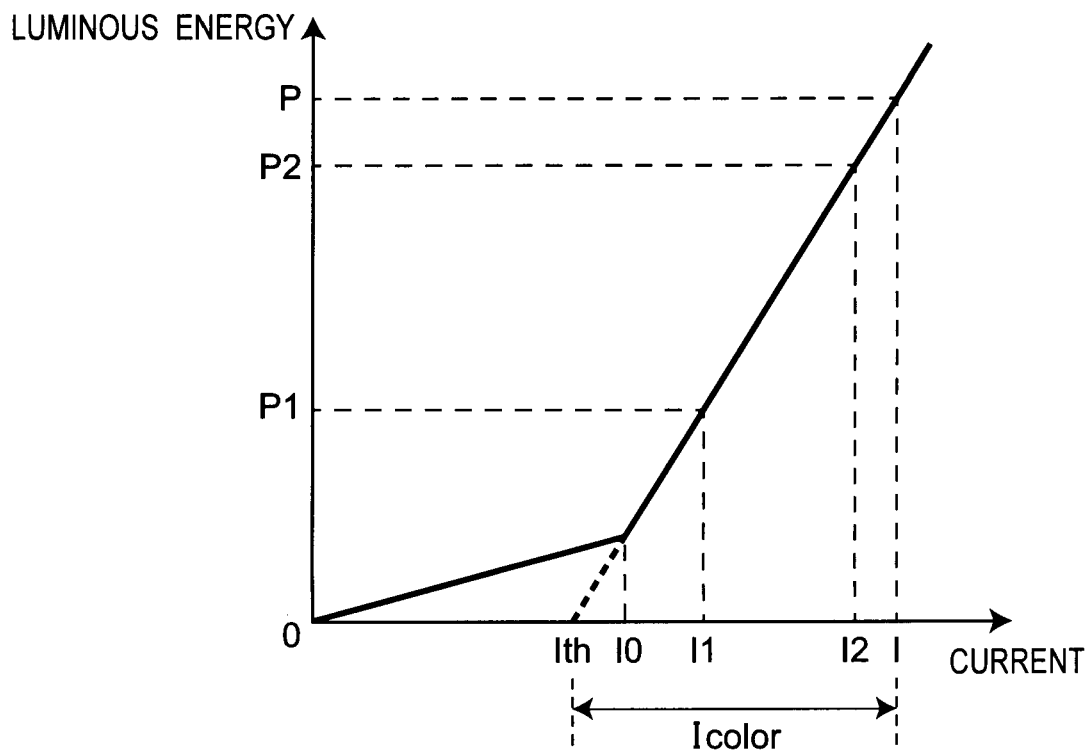
[Fig. 4]
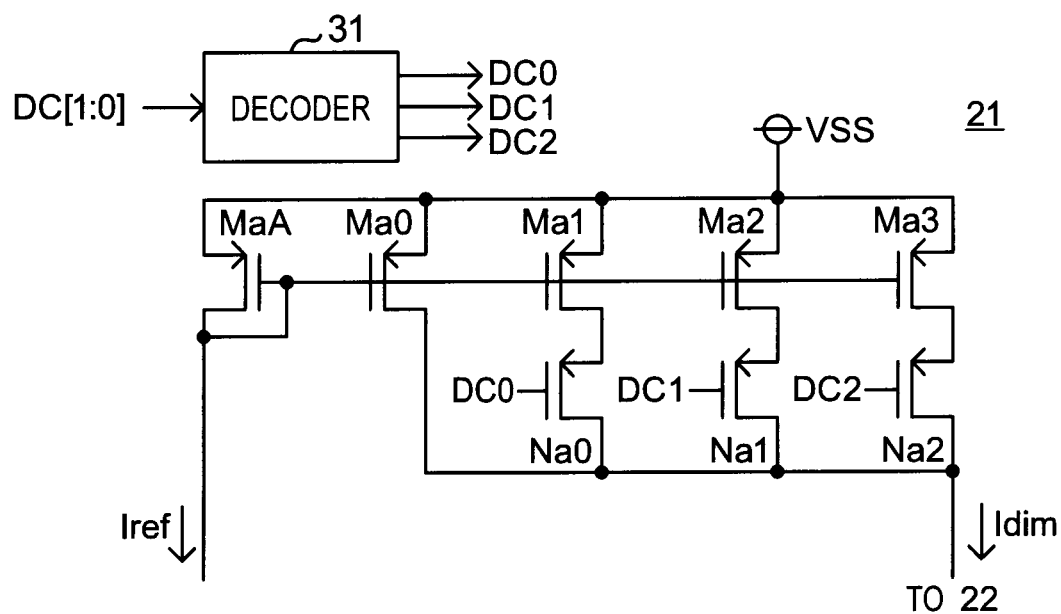

[Fig. 5]
| DC[1] | DC[0] | DC0 | DC1 | DC2 |
|---|---|---|---|---|
| 0 | 0 | 1 | 1 | 1 |
| 0 | 1 | 0 | 1 | 1 |
| 1 | 0 | 0 | 0 | 1 |
| 1 | 1 | 0 | 0 | 0 |
[Fig. 6]
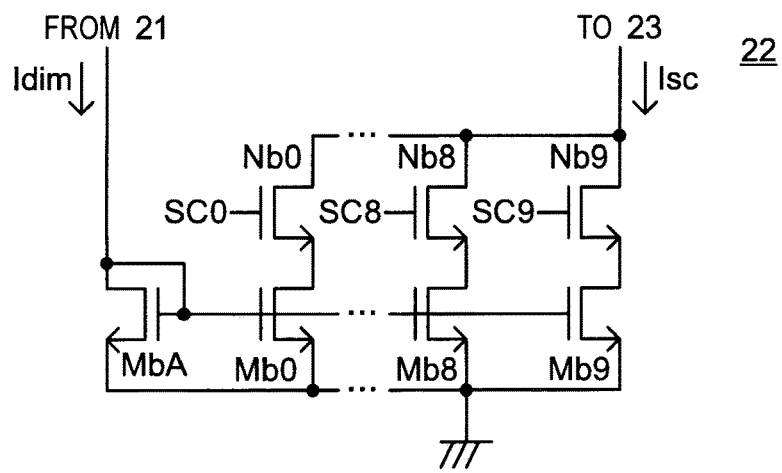
[Fig. 7]
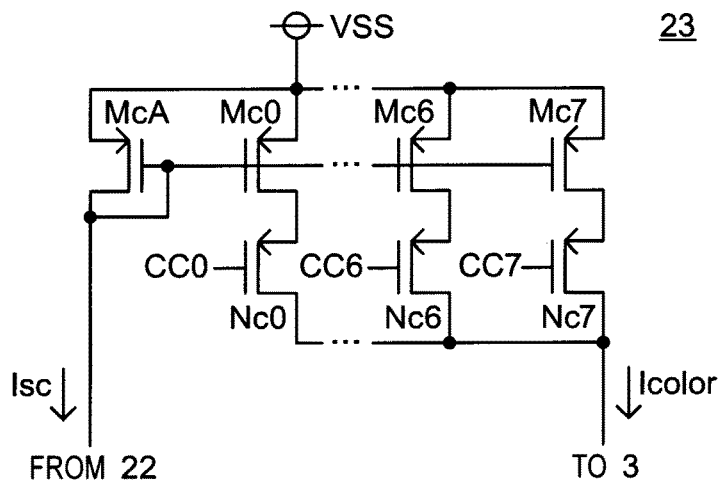

[Fig. 8]
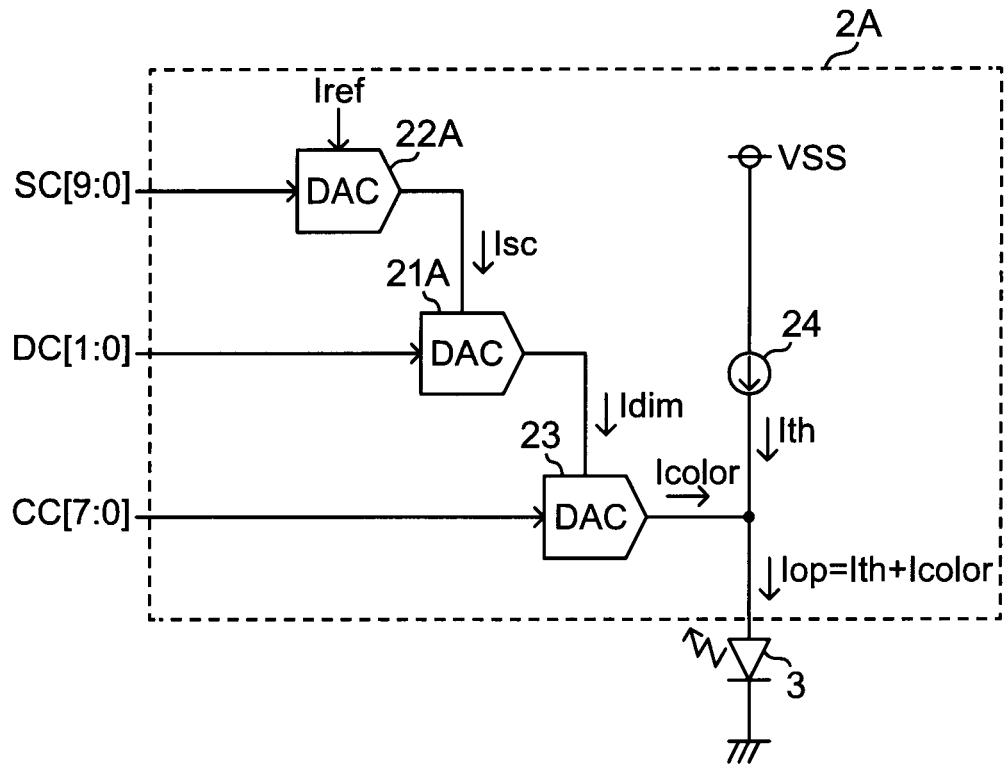
[Fig. 9]
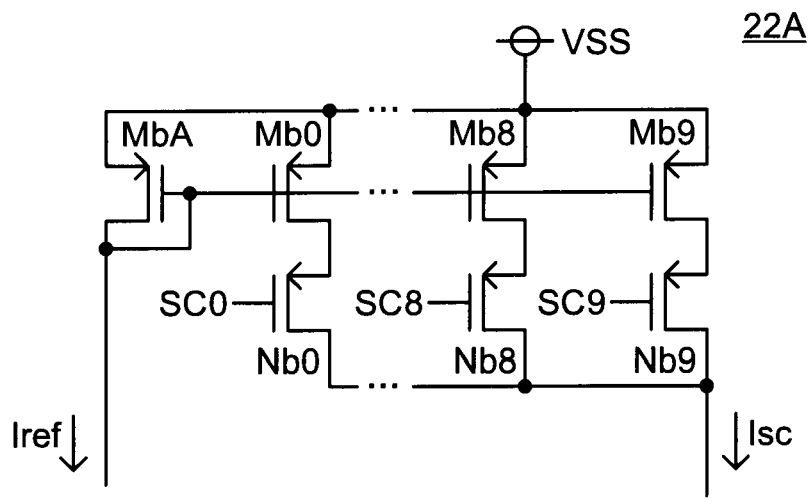

[Fig. 10]
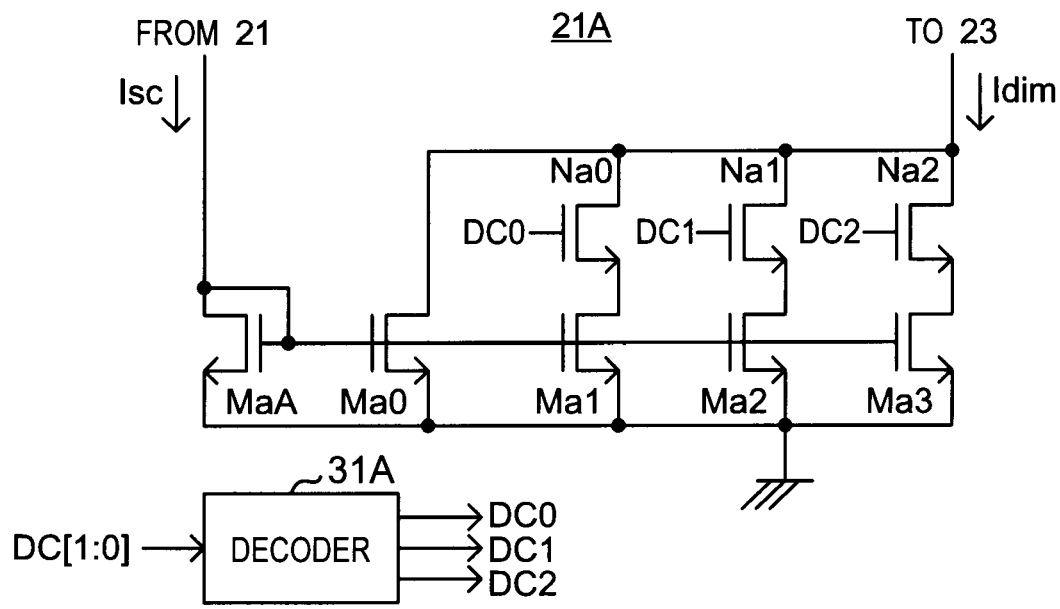
[Fig. 11]
| DC[1] | DC[0] | DC0 | DC1 | DC2 |
|---|---|---|---|---|
| 0 | 0 | 0 | 0 | 0 |
| 0 | 1 | 1 | 0 | 0 |
| 1 | 0 | 1 | 1 | 0 |
| 1 | 1 | 1 | 1 | 1 |

[Fig. 12]
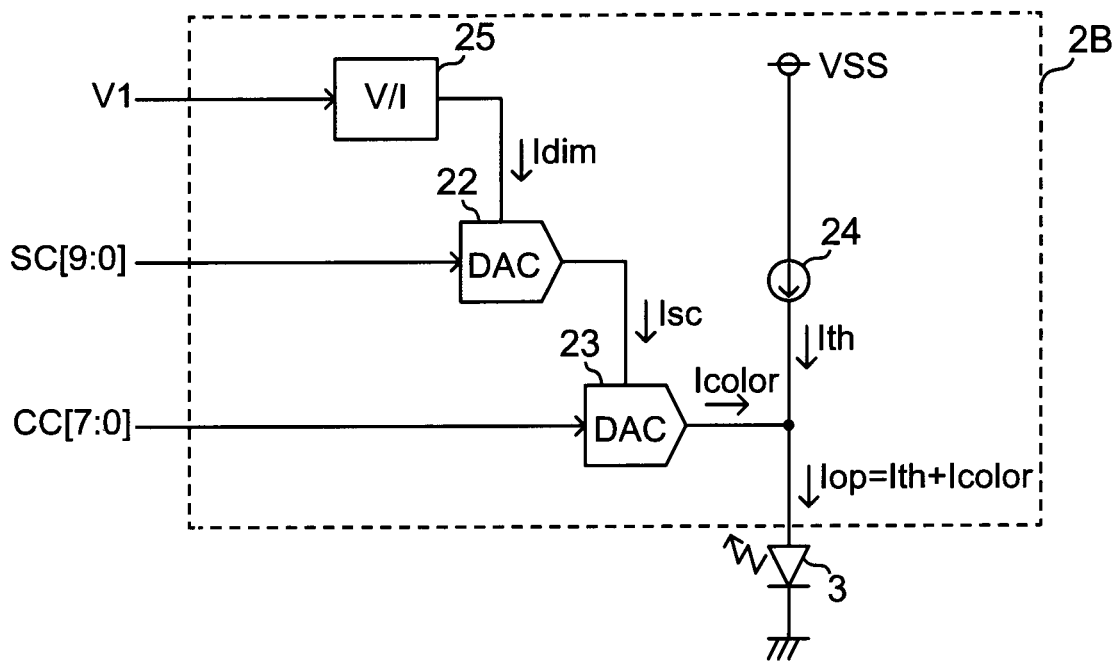
[Fig. 13]
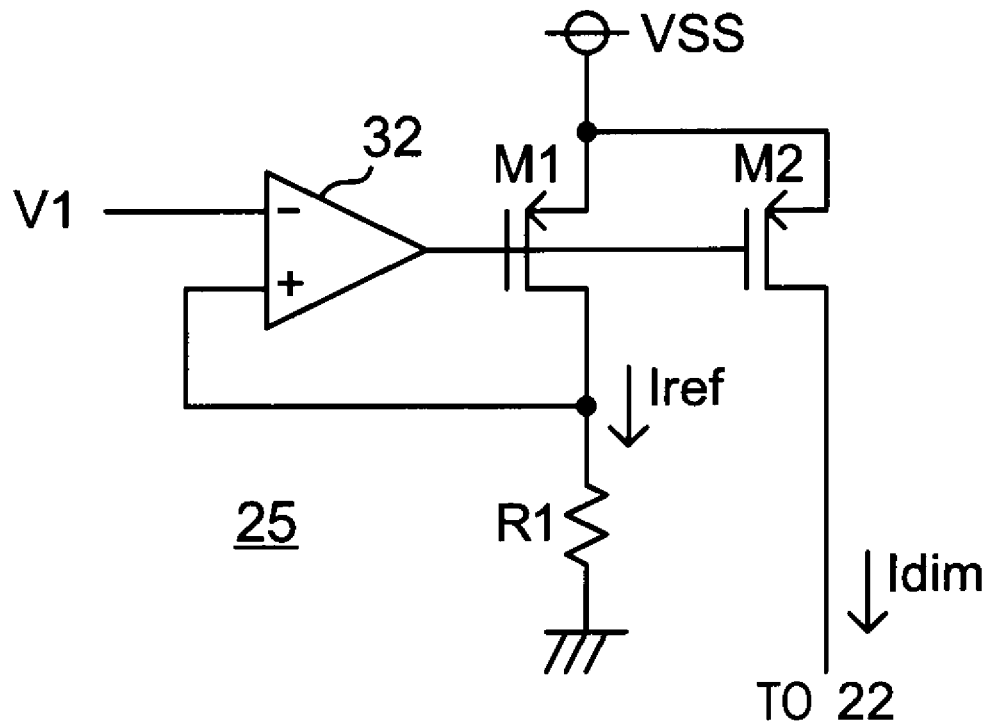

[Fig. 14]
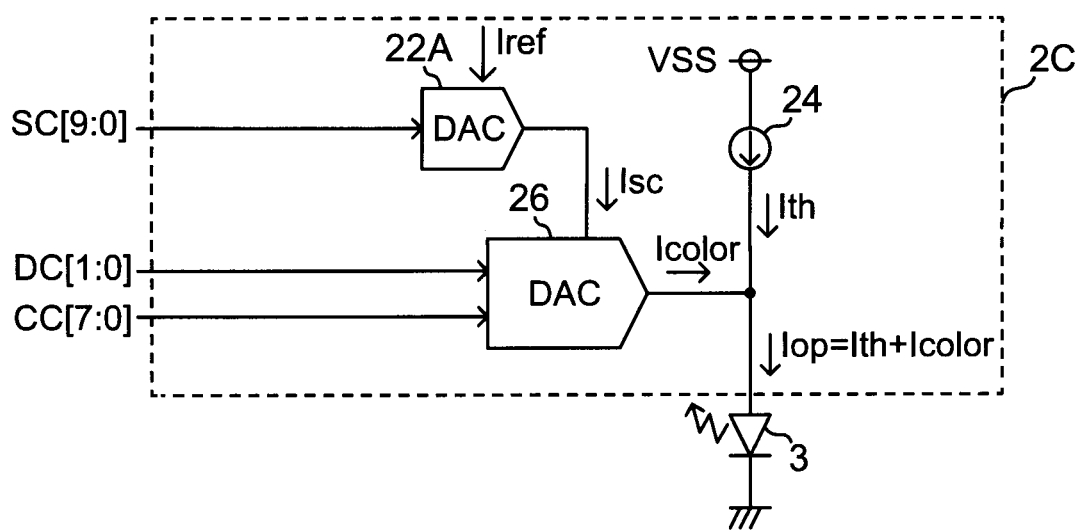

[Fig. 15]
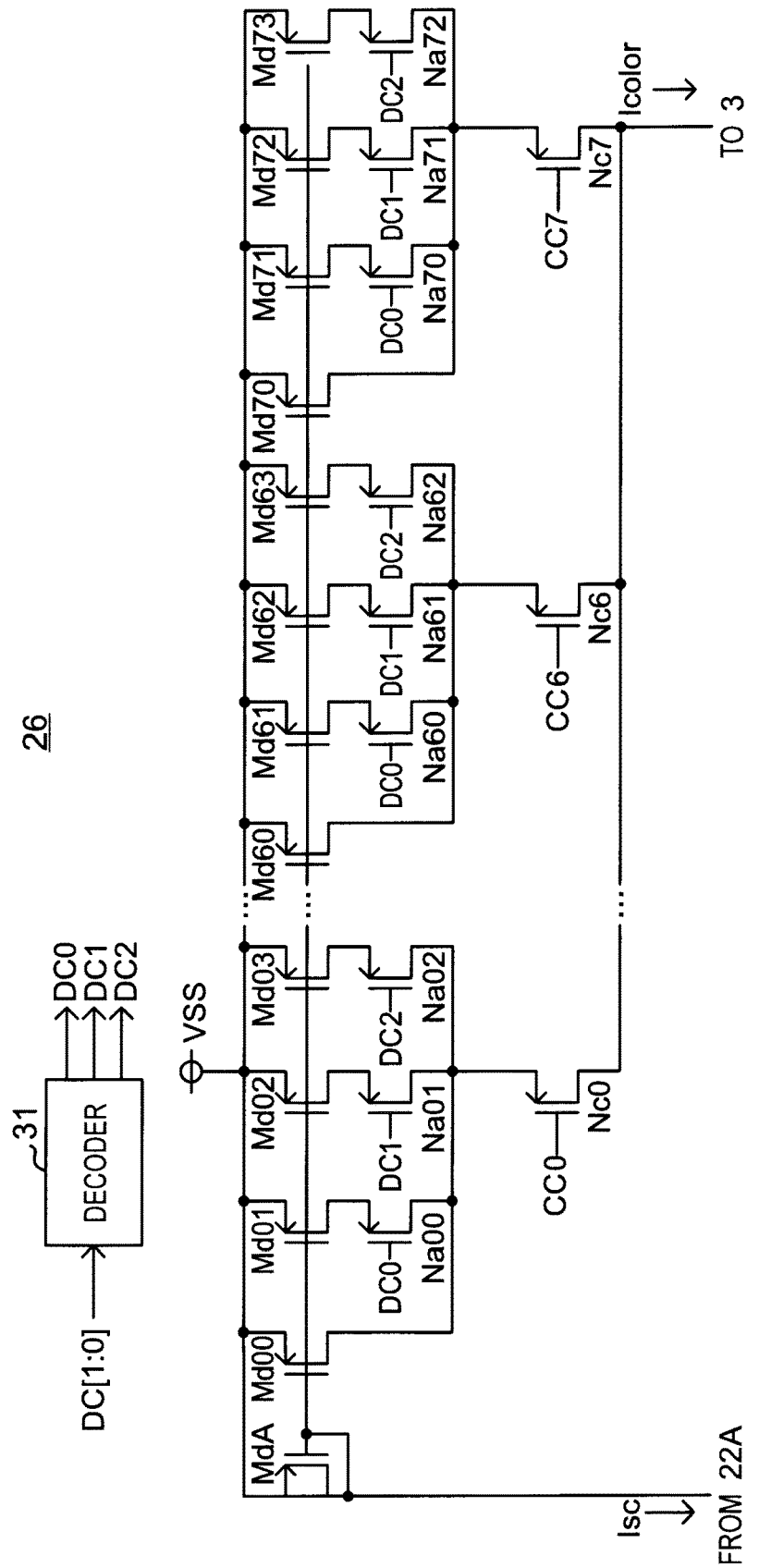

[Fig. 16]
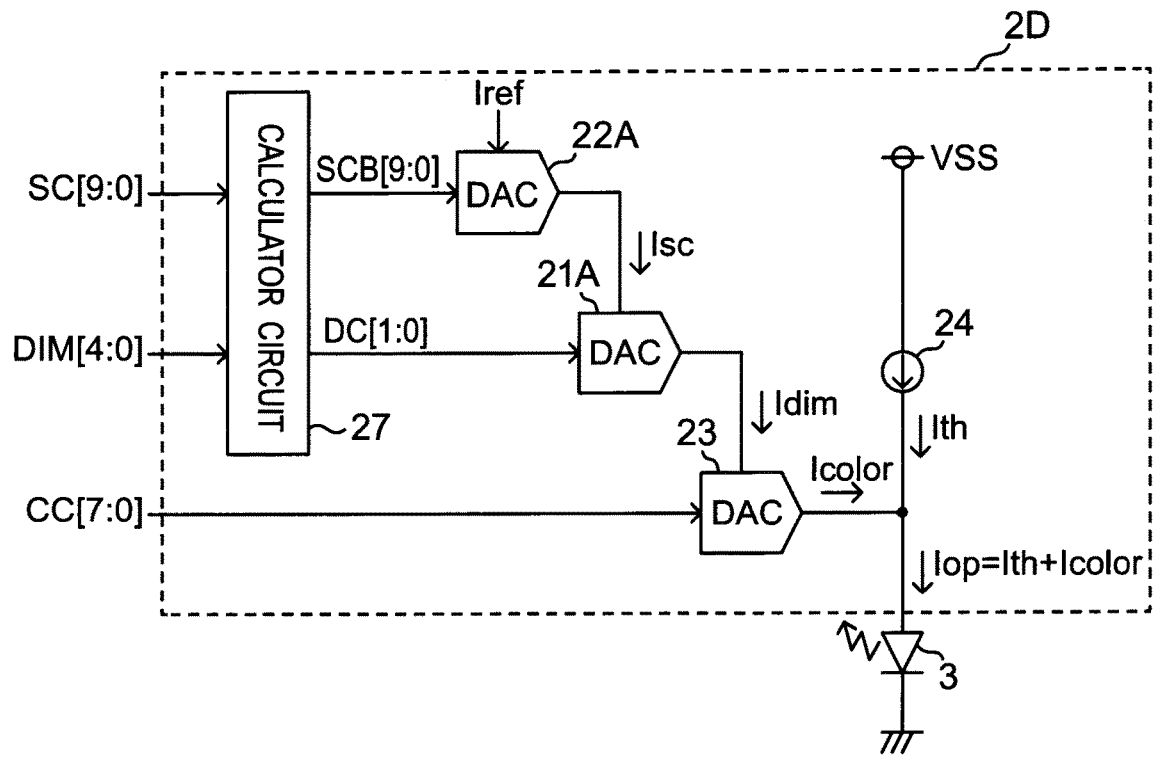
[Fig. 17]
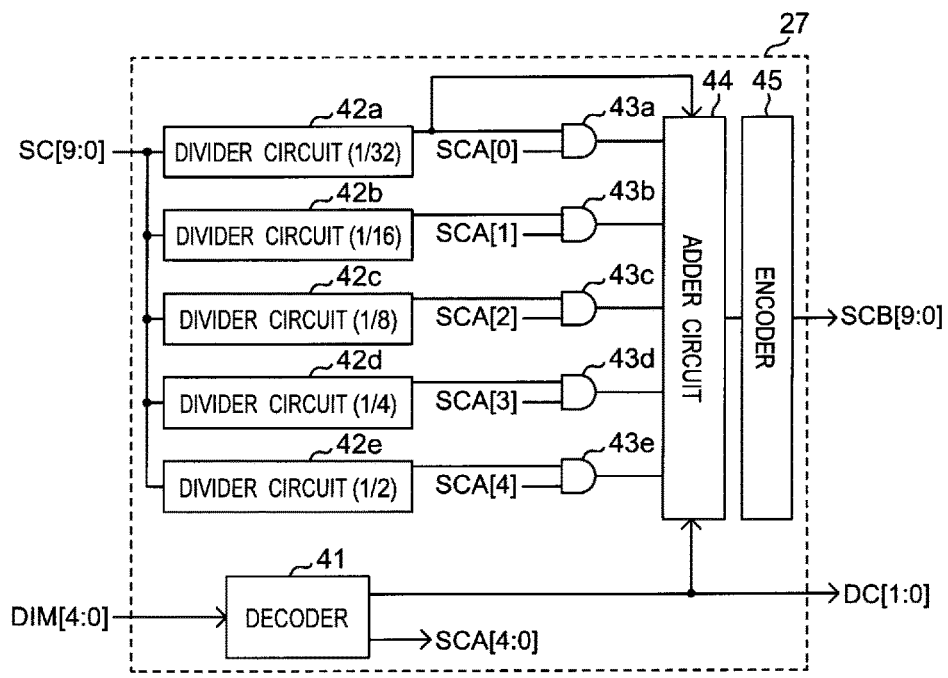

[Fig. 18]

| DIM[4:0] | DIMMING RATIO | DC[1:0] | SCA[4:0] | | | | | CORRECTION FACTOR | SC[9:0] | | |
|---|---|---|---|---|---|---|---|---|---|---|---|
| | | | | | | | | | 1023 | 512 | 511 |
| | | | | | | | | | SCB[9:0] | | |
| 0 | 32/32 | 3 | 1 | 1 | 1 | 1 | 1 | 1 | 1018 | 512 | 506 |
| 1 | 31/32 | 3 | 1 | 1 | 1 | 1 | 0 | 1 | 987 | 496 | 491 |
| 2 | 30/32 | 3 | 1 | 1 | 1 | 0 | 1 | 1 | 955 | 480 | 475 |
| 3 | 29/32 | 3 | 1 | 1 | 1 | 0 | 0 | 1 | 924 | 464 | 460 |
| 4 | 28/32 | 3 | 1 | 1 | 0 | 1 | 1 | 1 | 891 | 448 | 443 |
| 5 | 27/32 | 3 | 1 | 1 | 0 | 1 | 0 | 1 | 860 | 432 | 428 |
| 6 | 26/32 | 3 | 1 | 1 | 0 | 0 | 1 | 1 | 828 | 416 | 412 |
| 7 | 25/32 | 3 | 1 | 1 | 0 | 0 | 0 | 1 | 797 | 400 | 397 |
| 8 | 24/32 | 3 | 1 | 0 | 1 | 1 | 1 | 1 | 763 | 384 | 379 |
| 9 | 23/32 | 3 | 1 | 0 | 1 | 1 | 0 | 1 | 732 | 368 | 364 |
| 10 | 22/32 | 3 | 1 | 0 | 1 | 0 | 1 | 1 | 700 | 352 | 348 |
| 11 | 21/32 | 3 | 1 | 0 | 1 | 0 | 0 | 1 | 669 | 336 | 333 |
| 12 | 20/32 | 3 | 1 | 0 | 0 | 1 | 1 | 1 | 636 | 320 | 316 |
| 13 | 19/32 | 3 | 1 | 0 | 0 | 1 | 0 | 1 | 605 | 304 | 301 |
| 14 | 18/32 | 3 | 1 | 0 | 0 | 0 | 1 | 1 | 573 | 288 | 285 |
| 15 | 17/32 | 3 | 1 | 0 | 0 | 0 | 0 | 1 | 542 | 272 | 270 |
| 16 | 16/32 | 2 | 1 | 1 | 1 | 1 | 0 | 2 | 1018 | 512 | 506 |
| 17 | 15/32 | 2 | 1 | 1 | 1 | 0 | 0 | 2 | 955 | 480 | 475 |
| 18 | 14/32 | 2 | 1 | 1 | 0 | 1 | 0 | 2 | 891 | 448 | 443 |
| 19 | 13/32 | 2 | 1 | 1 | 0 | 0 | 0 | 2 | 828 | 416 | 412 |
| 20 | 12/32 | 2 | 1 | 0 | 1 | 1 | 0 | 2 | 763 | 384 | 379 |
| 21 | 11/32 | 2 | 1 | 0 | 1 | 0 | 0 | 2 | 700 | 352 | 348 |
| 22 | 10/32 | 2 | 1 | 0 | 0 | 1 | 0 | 2 | 636 | 320 | 316 |
| 23 | 9/32 | 2 | 1 | 0 | 0 | 0 | 0 | 2 | 573 | 288 | 285 |
| 24 | 8/32 | 1 | 1 | 1 | 1 | 0 | 0 | 4 | 1017 | 512 | 505 |
| 25 | 7/32 | 1 | 1 | 1 | 0 | 0 | 0 | 4 | 890 | 448 | 442 |
| 26 | 6/32 | 1 | 1 | 0 | 1 | 0 | 0 | 4 | 762 | 384 | 378 |
| 27 | 5/32 | 1 | 1 | 0 | 0 | 0 | 0 | 4 | 635 | 320 | 315 |
| 28 | 4/32 | 0 | 1 | 1 | 0 | 0 | 0 | 8 | 1014 | 512 | 502 |
| 29 | 3/32 | 0 | 1 | 0 | 0 | 0 | 0 | 8 | 759 | 384 | 375 |
| 30 | 2/32 | 0 | 0 | 1 | 0 | 0 | 0 | 8 | 503 | 256 | 247 |
| 31 | 1/32 | 0 | 0 | 0 | 0 | 0 | 0 | 8 | 248 | 128 | 120 |

[Fig. 19]
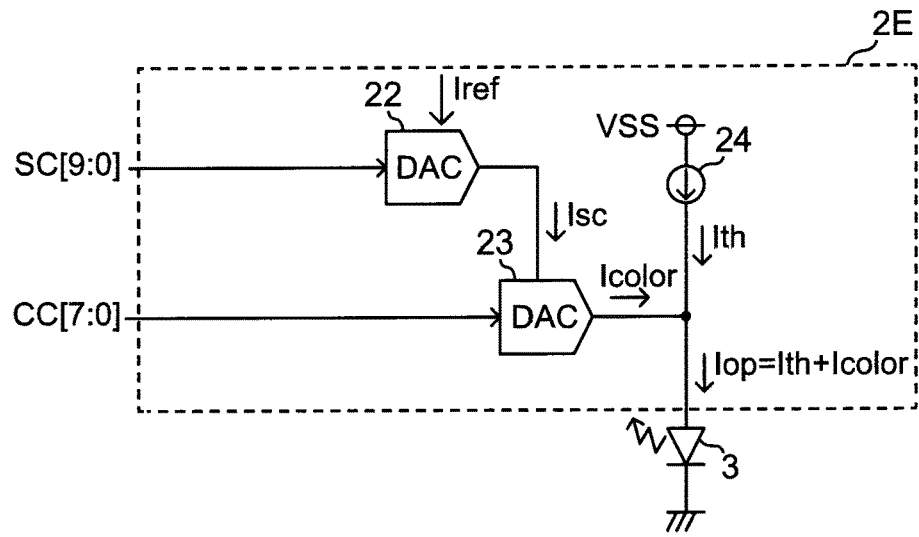
[Fig. 20]
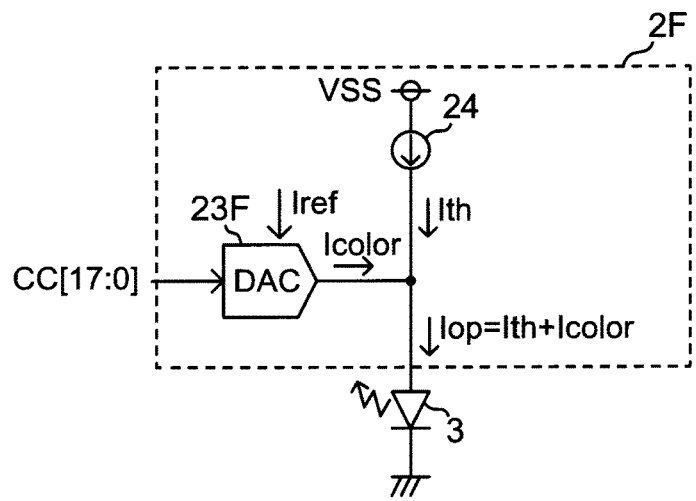
[Fig. 21]
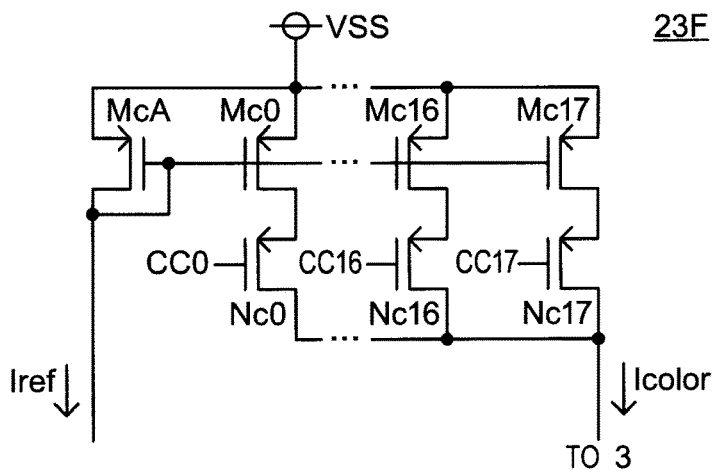

SEMICONDUCTOR LASER DRIVER HAVING ELECTRONIC DIMMING FUNCTION WITHOUT USING OPTICAL COMPONENTS

TECHNICAL FIELD

The present invention relates to a semiconductor laser driver and an electronic device.

BACKGROUND ART

Electronic devices are known, each device being provided with a semiconductor laser element, and a semiconductor laser driver for controlling a current to be supplied to the semiconductor laser element. The electronic devices include, for example, an imaging apparatus, such as a laser printer or a projector, which drives a semiconductor laser element and scans a beam generated by the semiconductor laser element in a one-dimensional or two-dimensional manner (e.g., see Patent Literature 1). Recently, small portable projectors (also referred to as pico projectors) are commercially available, each driving the semiconductor laser element.

When a portable projector is used, ambient brightness significantly changes depending on the place where the projector is installed. Therefore, the portable projector requires a dimming function for controlling brightness of a projected image so as to make the projected image more visible against the background. In particular, when a projector is used as a head-up display for a vehicle such as a passenger car, background brightness significantly changes depending on fine weather or rainy weather, day or night, inside or outside of a tunnel, etc., and therefore, the dimming function is highly required. Conventionally, for dimming, it is known to attenuate the intensity of light by using optical components, such as a neutral density (ND) filter, or by reducing an amount of image data.

CITATION LIST

Patent Literature

PTL 1: Japanese Patent No. 5672845

SUMMARY OF INVENTION

Technical Problem

In the case of the dimming using the optical components, the intensity of light generated by the semiconductor laser element is attenuated through a filter to a desired value. As a result, electric power is converted into heat, possibly leading to low optical energy efficiency, increased power consumption, and an increased heating value. Further, in the cased of the dimming using the optical components, a room is needed for mechanically moving the optical components. Therefore, it is difficult to reduce the projector's size, and it requires an increased cost for components.

On the other hand, in the case of the dimming by reducing the amount of image data, although the above mentioned problems are solved, degradation in an image, such as a moire pattern, appears due to reduction of the amount of image data, resulting in degraded image quality.

An object of the present invention is to provide a semiconductor laser driver having a dimming function, and being less likely to suffer from reduced optical energy efficiency, increased power consumption and heating value, increased size and cost, and degraded image quality.

Solution to Problem

According to an aspect of the present invention, a semiconductor laser driver for controlling a current to be supplied to a semiconductor laser element is provided. The semiconductor laser driver is provided with a first current generator circuit, a second current generator circuit, and a third current generator circuit. The first current generator circuit generates a first current having a current value variable in accordance with a first control signal. The second current generator circuit generates a second current by limiting the first current so as to have a current value variable in accordance with a second control signal. The third current generator circuit generates a third current by limiting the second current so as to have a current value variable in accordance with a third control signal, and supplies the third current to the semiconductor laser element. Rates at which the first and second control signals change are set to be lower than a rate at which the third control signal changes.

Advantageous Effects of Invention

In accordance with the semiconductor laser driver according to one aspect of the present invention, it is possible to provide the semiconductor laser driver having a dimming function, and being less likely to suffer from reduced optical energy efficiency, increased power consumption and heating value, increased size and cost, and degraded image quality.

BRIEF DESCRIPTION OF DRAWINGS

FIG. 1 is a block diagram showing a configuration of a projector provided with semiconductor laser drivers 2-1 to 2-3 according to a first embodiment.

FIG. 2 is a circuit diagram showing a configuration of a semiconductor laser driver 2 of FIG. 1.

FIG. 3 is a graph schematically showing a characteristic of a luminous energy with respect to a current flowing through the semiconductor laser element 3 of FIG. 1.

FIG. 4 is a circuit diagram showing a configuration of a digital-to-analog converter 21 of FIG. 2.

FIG. 5 is a table showing operation of a decoder 31 of FIG. 4.

FIG. 6 is a circuit diagram showing a configuration of a digital-to-analog converter 22 of FIG. 2.

FIG. 7 is a circuit diagram showing a configuration of a digital-to-analog converter 23 of FIG. 2.

FIG. 8 is a circuit diagram showing a configuration of a semiconductor laser driver 2A according to a second embodiment.

FIG. 9 is a circuit diagram showing a configuration of a digital-to-analog converter 22A of FIG. 8.

FIG. 10 is a circuit diagram showing a configuration of a digital-to-analog converter 21A of FIG. 8.

FIG. 11 is a table showing operation of a decoder 31A of FIG. 10.

FIG. 12 is a circuit diagram showing a configuration of a semiconductor laser driver 2B according to a third embodiment.

FIG. 13 is a circuit diagram showing a configuration of a voltage-to-current converter 25 of FIG. 12.

FIG. 14 is a circuit diagram showing a configuration of a semiconductor laser driver 2C according to a fourth embodiment.

FIG. 15 is a circuit diagram showing a configuration of a digital-to-analog converter 26 of FIG. 14.

FIG. 16 is a circuit diagram showing a configuration of a semiconductor laser driver 2D according to a fifth embodiment.

FIG. 17 is a circuit diagram showing a configuration of a calculator circuit 27 of FIG. 16.

FIG. 18 is a table showing operation of the calculator circuit 27 of FIG. 16.

FIG. 19 is a circuit diagram showing a configuration of a semiconductor laser driver 2E according to a first comparison example.

FIG. 20 is a circuit diagram showing a configuration of a semiconductor laser driver 2F according to a second comparison example.

FIG. 21 is a circuit diagram showing a configuration of a digital-to-analog converter 23F of FIG. 20.

DESCRIPTION OF EMBODIMENTS

Hereinafter, characterizing features of respective embodiment of the present invention will be described in detail with reference to the drawings.

First Embodiment

FIG. 1 is a block diagram showing a configuration of a projector provided with semi-conductor laser drivers 2-1 to 2-3 according to a first embodiment. The projector of FIG. 1 is an electronic device provided with an image processing device 1, semi-conductor laser drivers 2-1 to 2-3, semiconductor laser elements (laser Diode: LD) 3-1 to 3-3, dichroic mirrors 4, 5, a micro electromechanical system (MEMS) minor device 6, and a screen 7.

The image processing device 1 generates and outputs control signals for the semi-conductor laser drivers 2-1 to 2-3 and the MEMS mirror device 6, based on inputted image data. In accordance with the control signals from the image processing device 1, the semiconductor laser drivers 2-1 to 2-3 control currents to be supplied to the semi-conductor laser elements 3-1 to 3-3, respectively. The semiconductor laser elements 3-1 to 3-3 generate blue light (B), green light (G), and red light (R), respectively. The blue light generated by the semiconductor laser element 3-1 passes through the dichroic mirrors 4, 5 and is sent to the MEMS minor device 6. The green light generated by the semiconductor laser element 3-2 is reflected by the dichroic mirror 4, then passes through the dichroic mirror 5, and is sent to the MEMS minor device 6. The red light generated by the semiconductor laser element 3-3 is reflected by the dichroic mirror 5 and sent to the MEMS minor device 6. In accordance with the control signal from the image processing device 1, the MEMS mirror device 6 scans the light each of the semiconductor laser elements 3-1 to 3-3 in a two-dimensional manner, and projects the light onto the screen 7. Thus, an image corresponding to the inputted image data is displayed on the screen 7.

Hereinafter, the semiconductor laser drivers 2-1 to 2-3 are collectively referred to as "semiconductor laser driver 2", and the semiconductor laser elements 3-1 to 3-3 are collectively referred to as "semiconductor laser element 3".

FIG. 2 is a circuit diagram showing the configuration of the semiconductor laser driver 2 of FIG. 1. The semiconductor laser driver 2 is provided with digital-to-analog converters (DAC) 21 to 23 and a current source 24.

Before describing details of the semiconductor laser driver 2, we describe characteristics of the semiconductor laser element 3.

FIG. 3 is a graph schematically showing a characteristic of a luminous energy with respect to the current flowing through the semiconductor laser element 3 of FIG. 1. As shown in FIG. 3, the semiconductor laser element 3 does not oscillate before a supplied current I exceeds a threshold current Ith, and starts to oscillate when the current I exceeds the threshold current Ith. When the semiconductor laser element 3 is oscillating (i.e., when the current I larger than a current I0>Ith flows), the semiconductor laser element 3 emits light with a luminous energy P proportional to a part of the currents I, the part exceeding the threshold current Ith (i.e., current Icolor=I−Ith). Therefore, the luminous energy P of the semiconductor laser element 3 is given as follows.

[Math. 1]

$$P = \eta \times Icolor \quad (1)$$

Where η denotes a gradient of the characteristic of the luminous energy P with respect to the current I, when the current I larger than the current I0 flows.

Therefore, when the magnitude of the current Icolor increases or decreases in accordance with the dimming ratio, the luminous energy P of the semiconductor laser element 3 also increases or decreases accordingly. For example, when the magnitude of the current Icolor is reduced by half, the luminous energy P of the semiconductor laser element 3 is also reduced by half. In this way, it is possible to implement the dimming function.

Referring to FIG. 3, by measuring a luminous energy P1 at the time when the current I1>I1 flows through the semiconductor laser element 3, and a luminous energy P2 at the time when the current I2>I0 flows through the semiconductor laser element 3, a value of the threshold current Ith is given as follows.

[Math. 2]

$$Ith = (I1 \times P2 - I2 \times P1)/(P2 - P1) \quad (2)$$

Referring to FIG. 2, the digital-to-analog converters 21 to 23 generate a current Icolor having a current value variable in accordance with control signals DC[1:0], SC[9:0], and CC[7:0] from the image processing device 1, and supply the generated current Icolor to the semiconductor laser element 3. In addition, the current source 24 supplies, to the semiconductor laser element 3, the threshold current Ith at which the semiconductor laser element 3 starts to oscillate. Therefore, the sum of these currents (Iop=Ith+Icolor) flows through the semiconductor laser element 3.

The digital-to-analog converter 21 is a first current generator circuit that generates a first current Idim having a current value variable in accordance with a signal value of a first control signal DC[1:0]. The digital-to-analog converter 21 limits an inputted power supply current Iref so as to convert the control signal DC[1:0] into a current Idim having a current value that corresponds to the signal value of the first control signal DC[1:0]. The control signal DC[1:0] (also referred to as "dimming code") has a value of 0 to 3 in decimal, and sets a dimming ratio of the semiconductor laser element 3. The control signal DC[1:0] is, for example, set so as to make a projected image more visible against the background, in accordance with the intensity of ambient light around the projector of FIG. 1.

The digital-to-analog converter 22 is a second current generator circuit that generates a second current Isc by limiting the first current Idim so as to have a current value variable in accordance with a signal value of a second control signal SC[9:0]. The digital-to-analog converter 22 limits the current Idim so as to convert the control signal SC[9:0] into a current Isc having a current value that corresponds to the signal value of the control signal SC[9:0]. The control signal SC[9:0] (also referred to as "scale code") has a value of 0 to 1023 in decimal, and indicates an upper limit of the current Icolor flowing through the semiconductor laser element 3. The control signal SC[9:0] is set as user settings based on, for example, variations in characteristic ii of the semiconductor laser element 3 (see equation (1)), and the maximum luminous energy necessary for the projector of FIG. 1.

The digital-to-analog converter 23 is a third current generator circuit that generates a third current Icolor by limiting the second current Isc so as to have a current value variable in accordance with a signal value of a third control signal CC[7:0]. The digital-to-analog converter 23 limits the current Isc so as to convert the control signal CC[7:0] into the current Icolor having a current value that corresponds to the signal value of the control signal CC[7:0]. The control signal CC[7:0] (also referred to as "color code") has a value of 0 to 255 in decimal, and indicates a pixel value of an image to be displayed on the screen 7 by two-dimensional scanning of the MEMS mirror device 6. The third current Icolor is supplied to the semiconductor laser element 3.

FIG. 4 is a circuit diagram showing the configuration of the digital-to-analog converter 21 of FIG. 2. The digital-to-analog converter 21 is provided with switch elements MaA, Ma0 to Ma3, Na0 to Na2, and a decoder 31. The switch elements MaA, Ma0 to Ma3 form a multistage current mirror circuit, and operate in a strong-inversion mode. The gate widths of the switch elements Ma0 to Ma3 are set to ratios of 1:1:2:4. A drain of the switch element MaA is connected to an input terminal of the digital-to-analog converter 21, and the power supply current Iref is inputted thereto. In FIG. 2, for ease of illustration, the power supply current Iref is shown in the direction opposite to that of FIG. 4. Drains of the switch elements Ma1 to Ma3 are connected to an output terminal of the digital-to-analog converter 21 via the switch elements Na0 to Na2, respectively, and thus, the current Idim is outputted.

FIG. 5 is a table showing the operation of the decoder 31 of FIG. 4. The decoder 31 generates three bit values DC0 to DC2 from the control signal DC[1:0] as shown in FIG. 5, and applies the generated signals to gates of the switch elements Na0 to Na2, respectively. When the bit values DC0 to DC2 are "1", the corresponding switch elements Na0 to Na2 are turned off, and when the bit values DC0 to DC2 are "0", the corresponding switch elements Na0 to Na2 are turned on.

FIG. 6 is a circuit diagram showing the configuration of the digital-to-analog converter 22 of FIG. 2. The digital-to-analog converter 22 is provided with switch elements MbA, Mb0 to Mb9, and Nb0 to Nb9. The switch elements MbA, Mb0 to Mb9 form a multistage current mirror circuit, and operate in a strong-inversion mode. The gate widths of the switch elements Mb0 to Mb9 are set to ratios of 1:2:4:8:16:32:64:128:256:512. A drain of the switch element MbA is connected to an input terminal of the digital-to-analog converter 22, and the current Idim is inputted thereto. Drains of the switch elements Mb0 to Mb9 are connected to an output terminal of the digital-to-analog converter 22 via the switch elements Nb0 to Nb9, respectively, and thus, the current Isc is outputted. In FIG. 2, for ease of illustration, the current Isc is shown in the direction opposite to that of FIG. 6.

FIG. 7 is a circuit diagram showing the configuration of the digital-to-analog converter 23 of FIG. 2. The digital-to-analog converter 23 is provided with switch elements McA, Mc0 to Mc7, and Nc0 to Nc7. The switch elements McA, Mc0 to Mc7 form a multistage current mirror circuit, and operate in a strong-inversion mode. The gate widths of the switch elements Mc0 to Mc7 are set to ratios of 1:2:4:8:16:32:64:128. A drain of the switch element McA is connected to an input terminal of the digital-to-analog converter 23, and the current Isc is inputted thereto. In FIG. 2, for ease of illustration, the current Isc is shown in the direction opposite to that of FIG. 7. Drains of the switching elements Mc0 to Mc7 are connected to an output terminal of the digital-to-analog converter 23 via the switching elements Nc0 to Nc7, respectively, and thus, the current Icolor is outputted.

As described above, the digital-to-analog converters 21 to 23 are cascaded to each other such that the digital-to-analog converter 21 is located on the side of the current source side of the power supply current Iref (upstream), and the digital-to-analog converter 23 is located on the side of the semiconductor laser element 3 (downstream). Due to a delay occurring in the cascade connection, a rate at which the current Isc changes in response to the change in the control signal DC[1:0] is lower than a rate at which the current Isc changes in response to the change in the control signal SC[9:0]. Similarly, due to a delay occurring in the cascade connection, the rate at which the current Icolor changes in response to the change in the control signal SC[9:0] is lower than the rate at which the current Icolor changes in response to the change in the control signal CC[7:0]. Therefore, due to the delay generated in the cascade connection, the rate at which the current Icolor changes in response to the change in the control signal DC[1:0] is lower than the rate at which the current Icolor changes in response to the changes in the control signals SC[9:0] and CC[7:0].

The control signal DC[1:0] indicating the dimming ratio of the semiconductor laser element 3 changes at a rate which is not excessively fast, for example, so as not to impair the visibility of the projected image. In addition, the control signal SC[9:0] indicating the upper limit of the current Icolor flowing through the semiconductor laser element 3 may be a fixed value, for example, during the operation of the projector of FIG. 1, or may change in accordance with a user's operation. As compared to these control signals DC[1:0] and SC[9:0], the control signal CC[7:0] indicating the pixel value of the image changes at a higher rate. Therefore, it is required to generate the current Icolor with good response to the control signals DC[1:0], SC[9:0], and CC[7:0], respectively.

Therefore, taking into consideration the delay occurring in the cascade connection, the rate at which the control signal inputted into the upstream digital-to-analog converter changes is set to be lower than the rate at which the control signal inputted into the downstream digital-to-analog converter changes. That is, the rates at which the control signals DC[1:0] and SC[9:0] change are set to be lower than the rate at which the control signal CC[7:0] changes. In this case, the rate at which the control signal DC[1:0] changes may be set to be lower than the rate at which the control signal SC[9:0] changes. For example, the control signal DC[1:0] is set to change at a rate of several MHz, the control signal SC[9:0] is set to change at a rate of several tens of MHz, and the control signal CC[7:0] is set to change at a rate of several hundreds of MHz. These rates determine the response of the current Icolor to each of the control signals DC[1:0], SC[9:0], and CC[7:0].

Next, with reference to FIGS. 19 to 21, the operation of the semiconductor laser driver according to a comparison example will be described.

FIG. 19 is a circuit diagram showing a configuration of a semiconductor laser driver 2E according to a first comparison example. The semiconductor laser driver 2E of FIG. 19 is configured by removing the digital-to-analog converter 21 from the semiconductor laser driver 2 of FIG. 2. A semiconductor laser driver provided with two cascaded digital-to-analog converters is disclosed in, for example, Patent Literature 1.

According to the semiconductor laser driver 2E of FIG. 19, the current Icolor is given as follows.

[Math. 3]

$$Isc = \beta 1 \times Iref \times (SC[9:0]/1024) \quad (3)$$

$$Icolor = \alpha 1 \times Isc \times (CC[7:0]/256) \quad (4)$$

Where α1 and β1 are predetermined constants. In addition, the control signal SC[9:0] has a value of 0 to 1023 in decimal, and the control signal CC[7:0] has a value of 0 to 255 in decimal, as described above.

According to the equations (3) and (4), the current Icolor is proportional to the values of the control signals SC[9:0] and CC[7:0], and by changing these values, it is possible to increase or decrease the current value of the current Icolor.

In the case of adding the dimming function to the semiconductor laser driver 2E of FIG. 19, one may think of using a part of the bits of the control signals SC[9:0] and CC[7:0] for dimming. In the case of using a part of the bits of the control signal SC[9:0] for dimming, there are the following problems. The value of the control signal SC[9:0] is set in accordance with the range of the luminous energy of the semiconductor laser element 3 to be used. For example, when the semiconductor laser element 3 with a low luminous energy is used, the value of the control signal SC[9:0] is set to a low value. For example, when the value of the control signal SC[9:0] is set to "100" in decimal, the brightness can be controlled in the range of 0 to 100 using the control signal SC[9:0]. Therefore, the resolution of dimming effectively decreases from ten bits, which is originally available to the digital-to-analog converter 22, to six or seven bits. On the other hand, in the case of using a part of the bits of the control signal CC[7:0] for dimming, an amount of data available to indicate the pixel value of the image decreases, resulting in a narrower range of gradation of the pixel value, and degraded image quality.

FIG. 20 is a circuit diagram showing a configuration of a semiconductor laser driver 2F according to a second comparison example. The semiconductor laser driver 2F of FIG. 20 is provided with a digital-to-analog converter 23F and a current source 24. A control signal CC[17:0] having a larger number of bits than that of the control signal CC[7:0] of the digital-to-analog converter 23 of FIG. 2 is inputted into the digital-to-analog converter 23F. The digital-to-analog converter 23F generates the current Icolor by limiting the power supply current Iref so as to have a current value variable in accordance with a signal value of the control signal CC[17:0].

FIG. 21 is a circuit diagram showing the configuration of the digital-to-analog converter 23F of FIG. 20. The digital-to-analog converter 23F is provided with switch elements McA, Mc0 to Mc17, and Nc0 to Nc17. The switch elements McA, Mc0 to Mc17 form a multistage current mirror circuit, and operate in a strong-inversion mode. The gate widths of the switch elements Mc0 to Mc17 are set to ratios of 1:2:4:8:16:32:64:128:256:512: . . . : 131072. A drain of the switch element McA is connected to an input terminal of the digital-to-analog converter 23, and the current Iref is inputted thereto. In FIG. 20, for ease of illustration, the power supply current Iref is shown in the direction opposite to that of FIG. 21. Drains of the switch elements Mc0 to Mc17 are connected to an output terminal of the digital-to-analog converter 23 via the switch elements Nc0 to Nc17, respectively, and thus, the current Icolor is outputted.

According to the semiconductor laser driver 2F of FIG. 20, the current Icolor is given as follows.

[Math. 4]

$$Icolor = \gamma 1 \times Iref \times (CC[17:0]/262144) \quad (5)$$

Where γ1 is a predetermined constant. The control signal CC[17:0] has a value of 0 to 262143 in decimal.

According to the semiconductor laser driver 2F of FIG. 20, the gate widths of the switch elements Mc0 and Mc17 is set to a ratio of 1:131072. Therefore, the gate width of the switch element Mc0 is very small, and may significantly vary due to the limit of processing accuracy. Similarly, the gate widths of switch elements Mc1, Mc2, . . . corresponding to low-order bits of the control signal CC[17:0] are also very small, and may significantly vary. Therefore, it is difficult to generate the current value corresponding to the low-order bits of the control signal CC[17:0] with high accuracy. In addition, the control signal CC[17:0] indicates the pixel value of the image in a manner similar to that of the control signal CC[7:0] of the digital-to-analog converter 23 of FIG. 2. When the current value corresponding to the low-order bits of the control signal CC[17:0] has low accuracy, the accuracy in gradation of the pixel value decreases at a low luminous energy, and the image quality degrades. Therefore, it is not effective to simply increase the number of bits of the control signal, for the purpose of providing the dimming function without narrowing the range of gradation of the pixel value.

In addition, according to the semiconductor laser driver 2E of FIG. 19, also in the case of increasing the number of bits of the control signal SC[9:0] in order to improve the resolution of dimming, the accuracy of the current value corresponding to the low-order bits degrades in a manner similar to that of the semiconductor laser driver 2F of FIG. 20. Therefore, it is difficult to improve the effective resolution of dimming, when setting a low upper limit of the current Icolor flowing through the semiconductor laser element 3.

In addition, for displaying the image, the current Icolor needs to rapidly respond to the control signal indicating the pixel value of the image (e.g., several hundreds of MHz). If the number of bits of the control signal indicating the pixel value of the image is increased in order to provide the dimming function, the original rapidity of the digital-to-analog converter operating in accordance with this control signal is impaired.

As described with reference to FIGS. 19 to 21, it is required to provide a semi-conductor laser driver with a dimming function having sufficiently high resolution and accuracy, without narrowing the range of gradation of pixel values, nor impairing the response. In addition, it is required to provide a semiconductor laser driver having a dimming function, and being less likely to suffer from reduced optical energy efficiency, increased power consumption and heating value, increased size and cost, and degraded image quality, as described above.

Next, characterizing features of the semiconductor laser driver 2 according to the first embodiment will be described.

The semiconductor laser driver 2 of FIG. 2 is characterized by the dedicated digital-to-analog converter 21 for dimming. As shown in FIG. 2, by cascading the three digital-to-analog converters 21 to 23 having different functions from each other, it is possible to implement the dimming function, without impairing the response of the current Icolor to the control signal CC[7:0].

According to the semiconductor laser driver 2 of FIG. 2, the current Icolor is given as follows.

[Math. 5]

$$Idim = \gamma 2 \times Iref \times (DC/8) \quad (6)$$

$$Isc = \beta 2 \times Idim \times (SC[9:0]/1024) \quad (7)$$

$$Icolor = \alpha 2 \times Isc \times (CC[7:0]/256) \quad (8)$$

Where $\alpha 2$, $\beta 2$, and $\gamma 2$ are predetermined constants. According to FIGS. 4 and 5, the variable DC has a value of 1, 2, 4, or 8 in accordance with the value of the control signal DC[1:0]. In addition, the control signal SC[9:0] has a value of 0 to 1023 in decimal, and the control signal CC[7:0] has a value of 0 to 255 in decimal, as described above.

According to the equations (6) to (8), the current Icolor is proportional to the value of the variable DC, and by changing the value, it is possible to increase or decrease the current value of the current Icolor.

According to the first embodiment, the dimming function is provided only by the digital-to-analog converter 21, and the other digital-to-analog converters 22 and 23 are not involved in dimming. The resolution of dimming does not depend on the value of the control signal SC[0:9], but only depends on the number of bits of the control signal DC[0:1]. Therefore, even when the control signal SC[0:9] is set to a low value, the resolution of dimming does not decrease.

As described above, the semiconductor laser driver 2 according to the first embodiment is provided with the dedicated digital-to-analog converter 21 for dimming, and implements the dimming function. The semiconductor laser driver 2 is provided with the digital-to-analog converter 21 that operates at a low rate for dimming, the digital-to-analog converter 22 that operates at a medium rate for setting an upper limit of the current, and the digital-to-analog converter 23 that operates at a high rate and indicates the pixel value of the image. The semiconductor laser driver 2 cascades these digital-to-analog converters 21 to 23. The semiconductor laser driver 2 generates the current Icolor having a current value variable in accordance with the control signals DC[1:0], SC[9:0], and CC[7:0], which are digital codes, and supplies the generated current Icolor to the semiconductor laser element 3. Accordingly, the semiconductor laser driver 2 increases or decreases the current Icolor to be supplied to the semiconductor laser element 3 in accordance with the dimming ratio, and therefore, can increase or decrease the luminous energy generated by the semiconductor laser element 3. Further, as compared to the cases of FIGS. 19 to 21, the semiconductor laser driver 2 can linearly increase or decrease the luminous energy with respect to the dimming ratio, and can control the luminous energy with higher resolution over a wider range in a more noise-resistant manner. Further, the semiconductor laser driver 2 does not need to use optical components for dimming or to reduce an amount of image data, and therefore, it is possible to implement an imaging apparatus with low power consumption, small size, low cost, and higher image quality. Thus, the semiconductor laser driver 2 can control the current to be supplied to the semiconductor laser element 3, so as to obtain a desired luminous energy from the semiconductor laser element 3.

As described above, the semiconductor laser driver 2 can provide the dimming function having sufficiently high resolution and accuracy, without narrowing the range of gradation of pixel values, nor impairing response. In addition, while having the dimming function, the semiconductor laser driver 2 can be less likely to suffer from reduced optical energy efficiency, increased power consumption and heating value, increased size and cost, and degraded image quality.

Second Embodiment

As described above, the control signal SC[9:0] indicates the upper limit of the current Icolor flowing through the semiconductor laser element 3. Depending on specifications of the semiconductor laser element 3, the control signal SC[9:0] may have a fixed value set by the user, and the corresponding digital-to-analog converter may not require rapid response. In this case, the digital-to-analog converters 21 and 22 of FIG. 2 may be exchanged with each other.

FIG. 8 is a circuit diagram showing a configuration of a semiconductor laser driver 2A according to a second embodiment. The semiconductor laser driver 2A is provided with digital-to-analog converters 22A, 21A, and 23, and a current source 24.

The digital-to-analog converter 22A is a first current generator circuit that receives a power supply current Iref, and generates a first current Isc by limiting the power supply current Iref so as to have a current value variable in accordance with a signal value of a first control signal SC[9:0]. The control signal SC[9:0] indicates the upper limit of the current Icolor flowing through a semiconductor laser element 3, as described above.

The digital-to-analog converter 21A is a second current generator circuit that generates a second current Idim by limiting the first current Isc so as to have a current value variable in accordance with a signal value of a second control signal DC[1:0]. The control signal DC[1:0] indicates the dimming ratio of the semiconductor laser element 3, as described above.

The digital-to-analog converter 23 is a third current generator circuit that generates a third current Icolor by limiting the second current Idim so as to have a current value variable in accordance with a signal value of a third control signal CC[7:0]. The control signal CC[7:0] indicates the pixel value of the image to be displayed on the screen 7 by two-dimensional scanning of the MEMS mirror device 6, as described above. The third current Icolor is supplied to the semiconductor laser element 3.

FIG. 9 is a circuit diagram showing the configuration of the digital-to-analog converter 22A of FIG. 8. The digital-to-analog converter 22A is provided with switch elements MbA, Mb0 to Mb9, and Nb0 to Nb9. The switch elements MbA, Mb0 to Mb9 form a multistage current mirror circuit, and operate in a strong-inversion mode. The gate widths of the switch elements Mb0 to Mb9 are set to ratios of 1:2:4:8:16:32:64:128:256:512. A drain of the switch element MbA is connected to an input terminal of the digital-to-analog converter 22A, and the power supply current Iref is inputted thereto. In FIG. 8, for ease of illustration, the power supply current Iref is shown in the direction opposite to that of FIG. 9. Drains of the switch elements Mb0 to Mb9 are connected to an output terminal of the digital-to-analog converter 22A through switch elements Nb0 to Nb9, respectively, and thus, the current Isc is outputted.

FIG. 10 is a circuit diagram showing the configuration of the digital-to-analog converter 21A of FIG. 8. The digital-to-analog converter 21A is provided with switch elements MaA, Ma0 to Ma3, Na0 to Na2, and a decoder 31A. The switch elements MaA, Ma0 to Ma3 form a multistage current mirror circuit, and operate in a strong-inversion mode. The gate widths of the switch elements Ma0 to Ma3 are set to ratios of 1:1:2:4. A drain of the switch element MaA is connected to an input terminal of the digital-to-analog converter 21A, and the current Isc is inputted thereto. Drains of the switch elements Ma1 to Ma3 are connected to an output terminal of the digital-to-analog converter 21A via the switch elements Na0 to Na2, respectively, and thus, the current Idim is outputted. In FIG. 8, for ease of illustration, the current Idim is shown in the direction opposite to that of FIG. 10.

FIG. 11 is a table showing the operation of the decoder 31A of FIG. 10. The decoder 31A generates three bit values DC0 to DC2 from the control signal DC[1:0] as shown in FIG. 11, and applies the generated signals to the gates of the switch elements Na0 to Na2, respectively. When the bit values DC0 to DC2 are "1", the corresponding switch elements Na0 to Na2 are turned on, and when the bit values DC0 to DC2 are "0", the corresponding switch elements Na0 to Na2 are turned off.

The digital-to-analog converter 23 of FIG. 8 is configured in a manner similar to that of the digital-to-analog converter 23 of FIG. 2. However, instead of the current Isc of FIG. 2, the current Idim is inputted into the input terminal of the digital-to-analog converter 23 of FIG. 8.

Also in the case of the semiconductor laser driver 2A of FIG. 8, taking into consideration the delay occurring in the cascade connection, the rate at which the control signal inputted into the upstream digital-to-analog converter changes is set to be lower than the rate at which the control signal inputted into the downstream digital-to-analog converter changes. That is, the rates at which the control signals SC[9:0] and DC[1:0] change are set to be lower than the rate at which the control signal CC[7:0] changes. In this case, the rate at which the control signal SC[9:0] changes may be set to be lower than the rate at which the control signal DC[1:0] changes. For example, the control signal SC[9:0] is set to change at a rate of several MHz, the control signal DC[1:0] is set to change at a rate of several tens of MHz, and the control signal CC[7:0] is set to change at a rate of several hundreds of MHz.

According to the semiconductor laser driver 2A of FIG. 8, the current Icolor is given as follows.

[Math. 6]

$$Isc = \gamma 2 \times Iref \times (SC[9:0]/1024) \quad (9)$$

$$Idim = \beta 2 \times Isc \times (DC/8) \quad (10)$$

$$Icolor = \alpha 2 \times Idim \times (CC[7:0]/256) \quad (11)$$

Where $\alpha 2$, $\beta 2$, and $\gamma 2$ are predetermined constants. According to FIGS. 10 and 11, the variable DC has a value of 1, 2, 4, or 8 in accordance with the value of the control signal DC[1:0]. In addition, the control signal SC[9:0] has a value of 0 to 1023 in decimal, and the control signal CC[7:0] has a value of 0 to 255 in decimal, as described above.

According to the equations (9) to (11), the semiconductor laser driver 2A according to the second embodiment operates in a manner similar to that of the semiconductor laser driver 2 according to the first embodiment, and exerts similar advantageous effects thereto.

Third Embodiment

The semiconductor laser driver 2 of FIG. 2 may be provided with a voltage-to-current converter, instead of the digital-to-analog converter, as the current generator circuit for generating a current having a current value variable in accordance with a control signal indicating the dimming ratio of the semiconductor laser element 3.

FIG. 12 is a circuit diagram showing a configuration of a semiconductor laser driver 2B according to a third embodiment. The semiconductor laser driver 2B is provided with a voltage-to-current converter (V/I) 25, digital-to-analog converters 22 and 23, and a current source 24.

FIG. 13 is a circuit diagram showing the configuration of the voltage-to-current converter 25 of FIG. 12. The voltage-to-current converter 25 is provided with an operational amplifier 32, switch elements M1 and M2, and a resistor R1. The voltage-to-current converter 25 is a first current generator circuit that converts a first control signal V1 into a first current Idim having a current value variable in accordance with the voltage value of the first control signal V1, to generate the first current Idim. The control signal V1 indicates a dimming ratio of a semiconductor laser element 3.

The digital-to-analog converters 22 and 23 of FIG. 12 are configured in a manner similar to that of the digital-to-analog converters 22 and 23 of FIG. 2.

Also in the case of the semiconductor laser driver 2A of FIG. 12, taking into consideration the delay occurring in the cascade connection, the rate at which the control signal inputted into the upstream digital-to-analog converter changes is set to be lower than the rate at which the control signal inputted into the downstream digital-to-analog converter changes. That is, the rate at which the control signals V1 and SC[9:0] changes ares set to be lower than the rate at which the control signal CC[7:0] changes. In this case, the rate at which the control signal V1 changes may be set to be lower than the rate at which the control signal SC[9:0] changes.

According to the semiconductor laser driver 2B of FIG. 12, the current Icolor is given as follows.

[Math. 7]

$$Idim = \gamma 2' \times (V1/R1) \quad (12)$$

$$Isc = \beta 2 \times Idim \times (SC[9:0]/1024) \quad (13)$$

$$Icolor = \alpha 2 \times Isc \times (CC[7:0]/256) \quad (14)$$

Where $\alpha 2$, $\beta 2$, and $\beta 2'$ are predetermined constants. In addition, the control signal SC[9:0] has a value of 0 to 1023 in decimal, and the control signal CC[7:0] has a value of 0 to 255 in decimal, as described above.

According to the equations (12) to (14), the current Icolor is proportional to the voltage value of the control signal V1, and by changing the value, it is possible to increase or decrease the current value of the current Icolor.

According to the third embodiment, the dimming function is provided only by the voltage-to-current converter 25, and the digital-to-analog converters 22 and 23 are not involved in dimming. The resolution of dimming does not depend on the value of the control signal SC[0:9], and but only depends on the voltage value of the control signal V1. Therefore, even when the control signal SC[0:9] is set to a low value, the resolution of dimming does not decrease.

The semiconductor laser driver 2B according to the third embodiment is obtained by merely replacing the digital-to-analog converter 21 of FIG. 2 with the voltage-to-current converter 25. Therefore, the semiconductor laser driver 2B operates in a manner similar to that of the semiconductor laser driver 2 according to the first embodiment, and exerts similar advantageous effects thereto.

Fourth Embodiment

According to the semiconductor laser driver 2 of FIG. 2 or the semiconductor laser driver 2A of FIG. 8, a gate-source voltage Vgs of each of the switch elements McA, Mc0 to Mc7 of the digital-to-analog converter 23 has the following characteristic.

[Math. 8]

$$Vgs - Vth = \sqrt{I/\beta} \qquad (15)$$

Where Vth is a threshold voltage of each of the switch elements McA, Mc0 to Mc7, I is a current flowing through each of the switch elements McA, Mc0 to Mc7, and β is a predetermined constant.

When the value of the control signal SC[9:0] is set to be low in the semiconductor laser driver 2 or 2A, the current inputted into the digital-to-analog converter 23 decreases. When the current inputted into the digital-to-analog converter 23 decreases, the left side of the equation (15) decreases, and each of the switch elements McA, Mc0 to Mc7 operates in a subthreshold region. Therefore, the settling time until each of the switch elements McA, Mc0 to Mc7 returns to the original operating point becomes longer. In this case, when the control signal CC[7:0] that is rapidly turned on and off is inputted into the digital-to-analog converter 23, noise occurs in the gate-source voltage Vgs of each of the switch elements McA, Mc0 to Mc7 due to capacitive coupling. Thus, when the value of the control signal SC[9:0] is set to be low, the current inputted into the digital-to-analog converter 23 decreases, and therefore, the noise resistance of the digital-to-analog converter 23 degrades. Similarly, also when the dimming ratio of the semiconductor laser element 3 is set to be low by dimming, the current inputted into the digital-to-analog converter 23 decreases, and therefore, the noise resistance of the digital-to-analog converter 23 decreases. In the fourth embodiment, such problem is solved.

FIG. 14 is a circuit diagram showing a configuration of a semiconductor laser driver 2C according to a fourth embodiment. The semiconductor laser driver 2C is provided with digital-to-analog converters 22A and 26 and a current source 24.

The digital-to-analog converter 22A of FIG. 14 is configured in a manner similar to that of the digital-to-analog converter 22A of FIG. 8.

The digital-to-analog converter 26 is configured such that the digital-to-analog converters 21A and 23 of FIG. 8 are integrated with each other. The digital-to-analog converter 26 is a current generator circuit that generates the current Icolor by limiting the current Isc so as to have a current value variable in accordance with the control signals DC[1:0] and CC[7:0].

FIG. 15 is a circuit diagram showing the configuration of the digital-to-analog converter 26 of FIG. 14. The digital-to-analog converter 26 is provided with switch elements MdA, Md00 to Md73, Na00 to Na72, and a decoder 31. The switch elements MdA, Md00 to Md73 form a multistage current mirror circuit, and operate in a strong-inversion mode. The gate widths of the switch elements Md00 to Md03 are set to ratios of 1:1:2:4, and the sum of the gate widths of the switch elements Md00 to Md03 is set to be equal to the gate width of the switch element Mc0 of the digital-to-analog converter 23 of FIG. 8. The gate widths of the switch elements Md10 to Md13 are set to ratios of 1:1:2:4, and the sum of the gate widths of the switch elements Md10 to Md13 is set to be equal to the gate width of the switch element Mc1 of the digital-to-analog converter 23 of FIG. 8. The gate widths of the switch elements Md20 to Md23 are set to ratios of 1:1:2:4, and the sum of the gate widths of the switch elements Md20 to Md23 is set to be equal to the gate width of the switch element Mc2 of the digital-to-analog converter 23 of FIG. 8. A similar process continues until the gate widths of the switch elements Md70 to Md73 are set. Therefore, the sum of the gate widths of the switch elements Md00 to Md03, the sum of the gate widths of the switch elements Md10 to Md13, . . . , and the sum of the gates of the switch elements Md70 to Md73 are set to ratios of 1:2:4:8:16:32:64:128. A drain of the switch element MdA is connected to an input terminal of the digital-to-analog converter 26, and the current Isc is inputted thereto. In FIG. 14, for ease of illustration, the current Isc is shown in the direction opposite to that of FIG. 15. Drains of the switch elements Md01 to Md03 are connected to an output terminal of the digital-to-analog converter 26 via the switch elements Na00 to Na02 and Nc0, respectively. Drains of the switch elements Md11 to Md13 are connected to the output terminal of the digital-to-analog converter 26 via the switch elements Na10 to Na12 and Nc1, respectively. Drains of the switching elements Md21 to Md23 are connected to the output terminal of the digital-to-analog converter 26 via the switching elements Na20 to Na22 and Nc2, respectively. A similar process continues until the switch elements Md71 to Md73 are connected to the output terminal of the digital-to-analog converter 26. The digital-to-analog converter 26 generates the current Icolor from its output terminal.

The decoder 31 of FIG. 15 operates in a manner similar to that of the decoder of FIG. 2 (see FIG. 5).

Similarly to the second embodiment, the rates at which the control signals SC[9:0] and DC[1:0] change are set to be lower than the rate at which the control signal CC[7:0] changes. In this case, the rate at which the control signal SC[9:0] changes may be set to be lower than the rate at which the control signal DC[1:0] changes.

According to the semiconductor laser driver 2C of FIG. 14, the current Icolor is given as follows.

[Math. 9]

$$Isc = \beta 3 \times Iref \times (SC[9:0]/1024) \qquad (16)$$

$$Icolor = \alpha 3 \times Isc \times (DC/8) \times (CC[7:0]/256) \qquad (17)$$

Where α3 and β3 are predetermined constants. The variable DC has a value of 1, 2, 4, or 8 in accordance with the value of the control signal DC[1:0]. In addition, the control signal SC[9:0] has a value of 0 to 1023 in decimal, and the control signal CC[7:0] has a value of 0 to 255 in decimal, as described above.

According to the equations (16) to (17), similarly to the first to third embodiments, the current Icolor is proportional to the value of the variable DC, and by changing the value, it is possible to increase or decrease the current value of the current Icolor. Further, according to the fourth embodiment, even when the dimming ratio of the semiconductor laser element 3 is set to be low by dimming, the current value of the current Isc does not decrease, and therefore, the switching elements MdA, Md00 to Md73 of the digital-to-analog converter 26 can operate in a strong-inversion mode.

According to the semiconductor laser driver 2C, the gate widths of the switch elements MdA, Md00 to Md73 of the digital-to-analog converter 26 may be variable and configurable using registers.

According to the semiconductor laser driver 2C of the fourth embodiment, the settling time until each of the switch elements McA, Mc0 to Mc7 returns to the original operating point does not become longer. Even when the control signal CC[7:0] that is rapidly turned on and off is inputted into the digital-to-analog converter 23, the gate-source voltage Vgs of each of the switch elements McA, Mc0 to Mc7 is less susceptible to noise occurring due to capacitive coupling.

Fifth Embodiment

According to the fourth embodiment, it is necessary to set the gate widths of the switch elements Md00 to Md73 of the digital-to-analog converter 26, in accordance with the resolution (number of bits) of dimming. For example, the ratio of gate widths of the switch elements Md00 and Md73 is set to a ratio of 1:512. When the semiconductor laser element 3 with a low luminous energy is used, the upper limit of the current Icolor may be small, and in that case, the gate widths of the switch elements Md00 to Md73 are also set to be small. The gate width cannot be made smaller than the minimum value determined by a design rule of a semiconductor process. Even when a switch element having a gate width smaller than the minimum value of the design rule is made, its accuracy cannot be guaranteed. Therefore, there is a limitation on reduction in gate width. Increasing a gate length may be used instead of reducing the gate width. However, in general, the matching accuracy of the current mirror including different gate lengths is poor, and the circuit area increases. According to a fifth embodiment, in order to solve the above mentioned problem, we describe a semiconductor laser driver capable of equivalently increasing a number of bits for dimming, without increasing a number of bits of a digital-to-analog converter.

FIG. 16 is a circuit diagram showing a configuration of a semiconductor laser driver 2D according to the fifth embodiment. The semiconductor laser driver 2D is provided with digital-to-analog converters 22A, 21A, and 23, a current source 24, and a calculator circuit 27. The digital-to-analog converters 22A, 21A, and 23, and the current source 24 of FIG. 16 are configured in a manner similar to that of the corresponding components of FIG. 8. The calculator circuit 27 receives control signals SC[9:0] and DIM[4:0], and calculates and outputs control signals SCB[9:0] and DC[1:0]. The control signal SCB[9:0] has a number of bits equal to a number of bits of the control signal SC[9:0]. The control signal DIM[4:0] has a larger number of bits than a number of bits of the control signal DC[1:0], and indicates the dimming ratio of the semiconductor laser element 3. Instead of the control signal SC[9:0] of FIG. 8, the control signal SCB[9:0] is inputted into the digital-to-analog converter 22A of FIG. 16.

In relation to the fifth embodiment, the control signal SCB[9:0] is also referred to as a "first control signal", the control signal DC[1:0] is also referred to as a "second control signal", and the control signal CC[7:0] is also referred to as a "third control signal". In addition, the control signal SC[9:0] is also referred to as a "fourth control signal", and the control signal DIM[4:0] is also referred to as a "fifth control signal".

FIG. 17 is a circuit diagram showing the configuration of the calculator circuit 27 of FIG. 16. The calculator circuit 27 is provided with a decoder 41, divider circuits 42a to 42e, AND circuits 43a to 43e, an adder circuit 44, and an encoder 45. The decoder 41 receives the control signal DIM[4:0], and outputs a control signal DC[1:0] and an internal signal SCA[4:0]. The divider circuits 42a to 42e divide the control signal SC[9:0] by 32, 16, 8, 4, and 2, respectively. Each of the AND circuits 43a to 43e calculates a logical product of a corresponding bit of the internal signal SCA[4:0] and a corresponding result of division of the divider circuits 42a to 42e. The adder circuit 44 adds the results of calculations of the AND circuits 43a to 43e and the divider circuit 42a, as follows.

[Math. 10]

$$\begin{aligned}SCB[9:0] = &\, SCA[4] \times SC[9:0]/2 + \\&\, SCA[3] \times SC[9:0]/4 + \\&\, SCA[2] \times SC[9:0]/8 + \\&\, SCA[1] \times SC[9:0]/16 + \\&\, SCA[0] \times SC[9:0]/32 + \\&\, \text{Correction Factor} \times SC[9:0]/32\end{aligned} \quad (18)$$

Therefore, the control signal SCB[9:0] has a value of 0 to 1023 in decimal.

FIG. 18 is a table showing the operation of the calculator circuit 27 of FIG. 16. A value of the control signal DIM[4:0] denotes a dimming ratio. A correction factor is determined in accordance with a value of the control signal DC[1:0]. Three right-most columns in FIG. 18 indicate values of the control signal SCB[9:0] calculated using the equation (18) in accordance with the value of the control signal DIM[4:0], when exemplary values 1023, 512, and 511 of the control signal SC[9:0] are inputted.

Referring to FIG. 17, the encoder 45 generates the control signal SCB[9:0] from the result of calculation of the adder circuit 44.

According to the equation (18), the control signal SCB[9:0] is calculated based on the high- and low-order bits of the control signal DIM[4:0], and based on the control signal SC[9:0]. In addition, according to the equation (18), the control signal DC[1:0] is calculated based on the high-order bits of the control signal DIM[4:0].

According to the semiconductor laser driver 2D of the fifth embodiment, it is possible to equivalently increase the number of bits for dimming, from 2 to 5. When the value of the control signal SCB[9:0] is not divisible by 2, 4, 8, 16, and/or 32, decimals are truncated, and the truncated part is an error.

According to the semiconductor laser driver 2D of the fifth embodiment, by using both the digital-to-analog converters 22A and 21A for dimming, it is possible to improve the resolution of dimming, without increasing the number of bits of the digital-to-analog converter itself. For example, in the case of using a 10-bit digital-to-analog converter 22A and a 2-bit digital-to-analog converter 21A, two high-order bits of the control signal DIM[4:0] are sent to the digital-to-analog converter 21A, and the remaining low-order bits of the control signal DIM[4:0] are processed by bit shift operation, and then sent to the digital-to-analog converter 22A. Thus, it is possible to equivalently implement 5-bit dimming.

Modified Embodiment

For example, in the digital-to-analog converter 21 of FIG. 4, the gate widths of the switch elements Na0 to Na2 may be set to 1:2:4 in a manner similar to that of the gate widths of the switch elements Ma1 to Ma3, or may be set to other values (e.g., mutually same values). Similarly, also in another digital-to-analog converter, the gate width of the switch element may be set.

The MEMS mirror device 6 may scan the light transmitted from the semiconductor laser elements 3-1 to 3-3 in a one-dimensional manner, instead of a two-dimensional manner, so as to project the light onto, for example, a photosensitive drum of a laser printer.

The semiconductor laser driver may be provided with four or more digital-to-analog converters cascaded in a manner similar to that of the embodiments.

REFERENCE SIGNS LIST

1: IMAGE PROCESSING DEVICE,
2, 2-1 to 2-3, 2A to 2D: SEMICONDUCTOR LASER DRIVER,
3, 3-1 to 3-3: SEMICONDUCTOR LASER ELEMENT (LD),
4, 5: DICHROIC MIRROR,
6: MEMS MIRROR DEVICE,
7: SCREEN,
21 to 23, 21A, 22A, 26: DIGITAL-TO-ANALOG CONVERTER (DAC),
24: CURRENT SOURCE,
25: VOLTAGE-TO-CURRENT CONVERTER (V/I),
27: CALCULATOR CIRCUIT,
31, 31A: DECODER,
32: OPERATIONAL AMPLIFIER,
41: DECODER,
42a to 42e: DIVIDER CIRCUIT,
43a to 43e: AND CIRCUIT,
44: ADDER CIRCUIT,
45: ENCODER,
MaA, Ma0 to Ma3, Na0 to Na2, MbA, Mb0 to Mb9, Nb0 to Nb9, McA, Mc0 to Mc7, Nc0 to Nc7, M1, M2, MdA, Md00 to Md73, Na00 to Na72: SWITCH ELEMENT,
R1: RESISTOR.

The invention claimed is:

1. A semiconductor laser driver for controlling a current to be supplied to a semiconductor laser element, the semiconductor laser driver comprising:
a first current generator circuit that generates a first current having a current value variable in accordance with a first control signal;
a second current generator circuit that generates a second current by limiting the first current so as to have a current value variable in accordance with a second control signal; and
a third current generator circuit that generates a third current by limiting the second current so as to have a current value variable in accordance with a third control signal, and supplies the third current to the semiconductor laser element,
wherein rates at which the first and second control signals change are set to be lower than a rate at which the third control signal changes.

2. The semiconductor laser driver as claimed in claim 1, wherein the rate at which the first control signal changes is set to be lower than the rate at which the second control signal changes.

3. The semiconductor laser driver as claimed in claim 1, wherein the first current generator circuit is a digital-to-analog converter that limits an inputted power supply current so as to convert the first control signal to the first current having a current value corresponding to a signal value of the first control signal,
wherein the second current generator circuit is a digital-to-analog converter that limits the first current so as to convert the second control signal to the second current having a current value corresponding to a signal value of the second control signal, and
wherein the third current generator circuit is a digital-to-analog converter that limits the second current so as to convert the third control signal to the third current having a current value corresponding to a signal value of the third control signal.

4. The semiconductor laser driver as claimed in claim 1, wherein the first current generator circuit is a voltage-to-current converter that converts the first control signal to the first current having a current value corresponding to a voltage value of the first control signal,
wherein the second current generator circuit is a digital-to-analog converter that limits the first current so as to convert the second control signal to the second current having a current value corresponding to a signal value of the second control signal, and
wherein the third current generator circuit is a digital-to-analog converter that limits the second current so as to convert the third control signal to the third current having a current value corresponding to a signal value of the third control signal.

5. The semiconductor laser driver as claimed in claim 3, wherein the first control signal indicates a dimming ratio of the semiconductor laser element,
wherein the second control signal indicates an upper limit of a current flowing through the semiconductor laser element, and
wherein the third control signal indicates a pixel value of a scanned image.

6. The semiconductor laser driver as claimed in claim 3, wherein the first control signal indicates an upper limit of a current flowing through the semiconductor laser element,
wherein the second control signal indicates a dimming ratio of the semiconductor laser element, and
wherein the third control signal indicates a pixel value of a scanned image.

7. The semiconductor laser driver as claimed in claim 6, wherein the second and third current generator circuits are integrated with each other, limit the first current so as to have a current value variable in accordance with the second and third control signals to generate the third current, and supply the third current to the semiconductor laser element.

8. The semiconductor laser driver as claimed in claim 3, further comprising a calculator circuit that receives a fourth control signal having a number of bits equal to a number of bits of the first control signal, receives a fifth control signal having a larger number of bits than a number of bits of the second control signal, and calculates and outputs the first and second control signals,
wherein the calculator circuit calculates the first control signal based on high-order bits and low-order bits of the fifth control signal, and based on the fourth control signal, and calculates the second control signal based on the high-order bits of the fifth control signal,
wherein the third control signal indicates a pixel value of a scanned image,
wherein the fourth control signal indicates an upper limit of a current flowing through the semiconductor laser element, and
wherein the fifth control signal indicates a dimming ratio of the semiconductor laser element.

9. The semiconductor laser driver as claimed in claim 1, further comprising a current source that supplies, to the semiconductor laser element, a threshold current at which the semiconductor laser element starts to oscillate.

10. An electronic device comprising:
a semiconductor laser element; and
a semiconductor laser driver for controlling a current to be supplied to the semiconductor laser element, the semiconductor laser driver comprising:

a first current generator circuit that generates a first current having a current value in accordance with a first control signal;

a second current generator circuit that generates a second current by limiting the first current so as to have a current value variable in accordance with a second control signal; and a third current generator circuit that generates a third current by limiting the second current so as to have a current value variable in accordance with a third control signal, and supplies the third current to the semiconductor laser element, wherein rates at which the first and second control signals change are set to be lower than a rate at which the third control signal changes.

\* \* \* \* \*